United States Patent
Li et al.

(10) Patent No.: US 7,404,033 B2
(45) Date of Patent: *Jul. 22, 2008

(54) METHOD FOR READING WHILE WRITING TO A SINGLE PARTITION FLASH MEMORY

(75) Inventors: Tieniu Li, San Jose, CA (US); Van D. Nguyen, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/545,325

(22) Filed: Oct. 10, 2006

(65) Prior Publication Data

US 2007/0033363 A1 Feb. 8, 2007

Related U.S. Application Data

(63) Continuation of application No. 10/431,748, filed on May 8, 2003, now Pat. No. 7,155,562.

(51) Int. Cl.
*G06F 12/14* (2006.01)
(52) U.S. Cl. ...................... 711/107; 711/103
(58) Field of Classification Search ............... None
See application file for complete search history.

(56) References Cited

U.S. PATENT DOCUMENTS

| | | | |
|---|---|---|---|
| 5,640,529 A | 6/1997 | Hasbun | |
| 5,867,430 A | 2/1999 | Chen et al. | |
| 5,974,528 A * | 10/1999 | Tsai et al. | 712/37 |
| 6,085,281 A | 7/2000 | Kopp et al. | |
| 6,151,664 A | 11/2000 | Borkenhagen et al. | |
| 6,189,070 B1 * | 2/2001 | See et al. | 711/103 |
| 6,507,881 B1 | 1/2003 | Chen | |
| 2002/0188812 A1 | 12/2002 | Sadhasivan et al. | |

* cited by examiner

*Primary Examiner*—Hyung S. Sough
*Assistant Examiner*—Duc T. Doan
(74) *Attorney, Agent, or Firm*—Leffert Jay & Polglaze, P.A.

(57) ABSTRACT

A device manager receives an operation request for a memory device. The device manager suspends interrupts to be serviced and determines if there is sufficient time available to perform the requested operation. If there is sufficient time available and the device manager is in an exclusive mode, the state of the memory device is checked to determine if it is currently executing an operation. If so, this operation is suspended and the requested operation is issued to the memory device. The device manager polls the memory device to determine when the requested operation has been completed. Upon completion, the interrupts are re-enabled and control of the memory device is returned to the system.

12 Claims, 3 Drawing Sheets

METHOD FOR READING WHILE WRITING TO A SINGLE PARTITION FLASH MEMORY

RELATED APPLICATIONS

This application is a continuation of U.S. patent application Ser. No. 10/431,748 (allowed), filed May 8, 2003 now U.S. Pat. No. 7,155,562 and titled, METHOD FOR READING WHILE WRITING TO A SINGLE PARTITION FLASH MEMORY, which is commonly assigned and incorporated by reference herein in their entirety.

BACKGROUND OF THE INVENTION

I. Field of the Invention

The present invention relates generally to memory devices and particularly to single partition flash memory devices.

II. Description of the Related Art

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices.

A single partition flash memory device has only one internal write charge pump. Therefore, writing data to the device, also referred to as programming, puts it into a busy state such that data cannot be read from it during the write operation. If a read operation is performed during the busy state, a logical 00 is typically returned. The busy state for a write operation may last 8-12 microseconds.

Similarly, initiating an erase operation of the flash memory device puts the memory device into the busy state. The device typically enters the busy state for 0.50-1.0 second during an erase operation. During this time, the device is not accessible.

Lack of accessibility during write and erase operations may cause a system using the flash memory device to operate slower than normal. The processor that is attempting to read the contents of the flash device must wait until the write or erase operations are complete before being able to obtain the desired data. There is a resulting need in the art for a single partition flash memory device, having multiple banks and device configurations, that permits a read operation during a write or erase operation.

DETAILED DESCRIPTION

The embodiments of the present invention provide a single partition flash memory device that has multiple banks and device configurations to perform a read operation during a write or erase operation. A device manager is used to control access to the memory devices during the read while write/erase operation.

While the subsequent discussion of the embodiments of the present invention refers to flash memory, any type of memory device that has similar characteristics may be used. For example non-volatile RAM (NOVRAM) or electrically erasable programmable read only memory (EEPROM) may be used.

Figure 1:
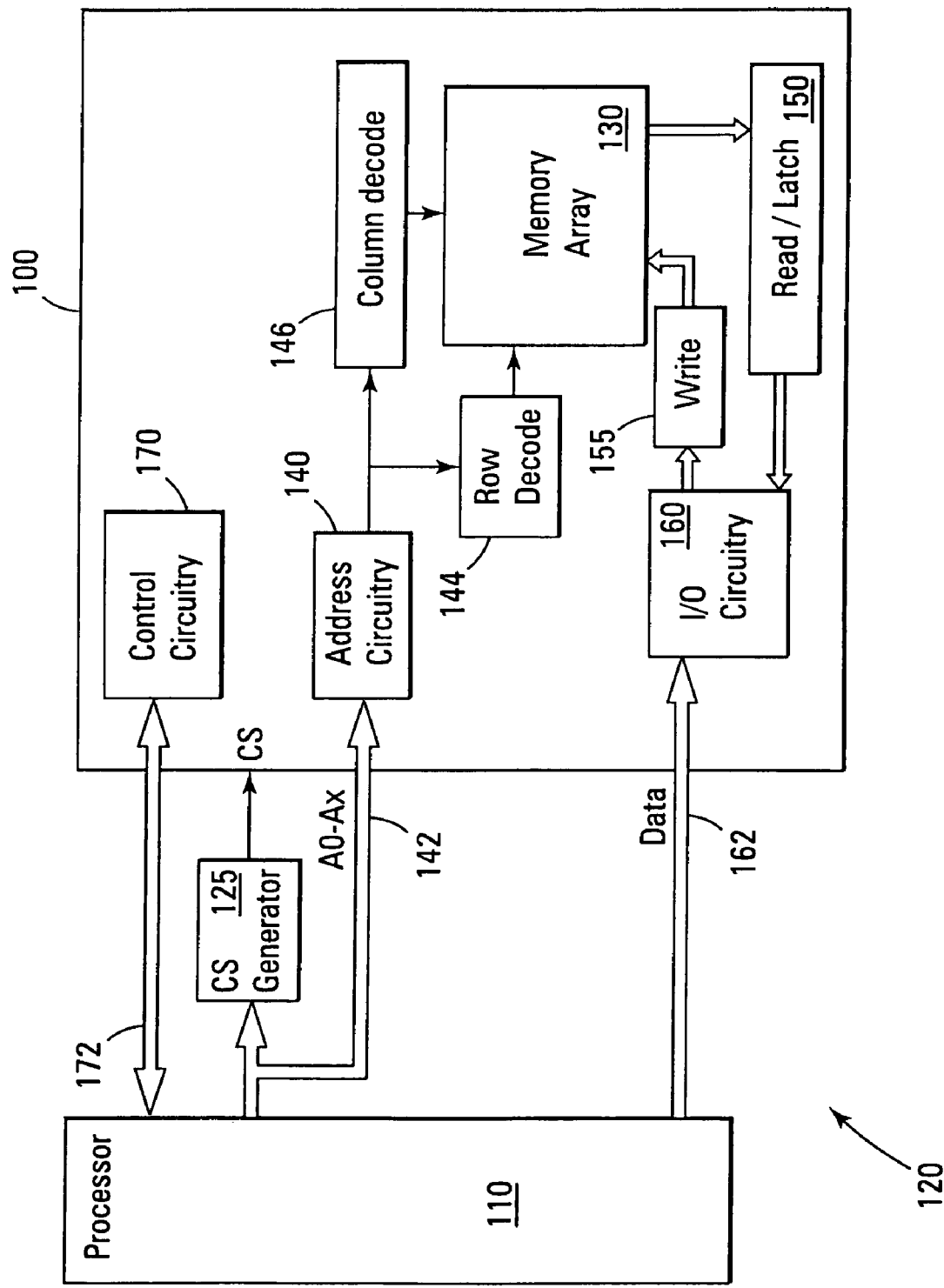
FIG. 1 shows a block diagram of one embodiment of a memory system of the present invention.

FIG. 1 is a functional block diagram of a memory device 100 of one embodiment of the present invention that is coupled to a controller circuit 110. The controller circuit 110 may be a microprocessor, a processor, or some other type of controlling circuitry. The memory device 100 and the controller 110 form part of an electronic system 120. The memory device 100 has been simplified to focus on features of the memory that are helpful in understanding the present invention.

The memory device includes an array of memory cells 130. The memory cells are non-volatile floating-gate memory cells and the memory array 130 is arranged in banks of rows and columns.

An address buffer circuit 140 is provided to latch address signals provided on address input connections A0-Ax 142. Address signals are received and decoded by a row decoder 144 and a column decoder 146 to access the memory array 130. It will be appreciated by those skilled in the art, with the benefit of the present description, that the number of address input connections depends on the density and architecture of the memory array 130. That is, the number of addresses increases with both increased memory cell counts and increased bank and block counts.

The memory device 100 reads data in the memory array 130 by sensing voltage or current changes in the memory array columns using sense/latch circuitry 150. The sense/latch circuitry, in one embodiment, is coupled to read and latch a row of data from the memory array 130. Data input and output buffer circuitry 160 is included for bi-directional data communication over a plurality of data connections 162 with the controller 110. Write circuitry 155 is provided to write data to the memory array.

Command control circuit 170 decodes signals provided on control connections 172 from the processor 110. These signals are used to control the operations on the memory array 130, including data read, data write, and erase operations.

Chip select generation circuitry 125 generates the chip select signals for the memory device 100. This circuitry 125 uses the address connections 142 from the controller 110 to generate the appropriate chip select signal depending on the address present on the address connections 142.

The flash memory device illustrated in FIG. 1 has been simplified to facilitate a basic understanding of the features of the memory. A more detailed understanding of internal circuitry and functions of flash memories are known to those skilled in the art.

Figure 2:
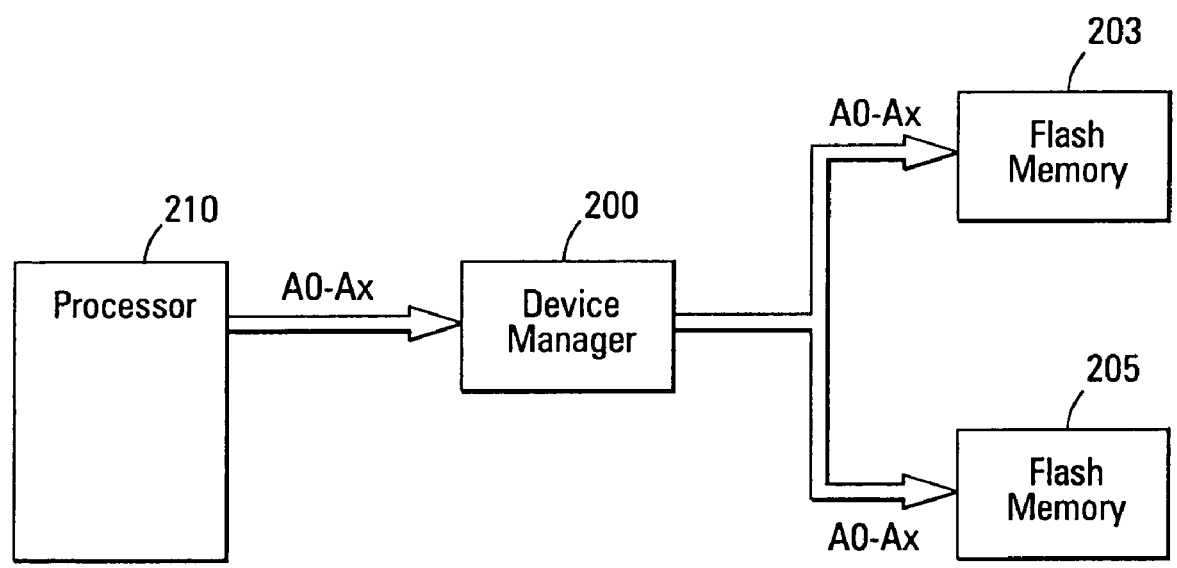
FIG. 2 shows a block diagram of another embodiment of a memory system of the present invention that incorporates a device manager module.

FIG. 2 illustrates a block diagram of another embodiment of a memory system of the present invention incorporating a device manager 200 that manages multiple memory devices 203 and 205. In one embodiment, the memory devices 203 and 205 are flash memory devices. Alternate embodiments use other types of memory devices as noted above.

The device manager 200 is a low-level software module that provides an interface between a processor 210 and the memory devices 203 and 205 being managed. In an alternate embodiment, the device manager 200 is a hardware device incorporating firmware for control of the device manager 200. For example, the device manager 200 may be an application specific integrated circuit or a field programmable gate array.

The device manager 200, as a software module, can be stored in one of the flash memories 203 or 205 or some other memory of the system. The processor 210 can execute the device manager 200 by reading the code from that particular memory device. In alternate embodiments, other control circuits execute the device manager 200.

The memory system illustrated in FIG. 2, in one embodiment, operates in two modes: exclusive and non-exclusive. In the exclusive mode, all flash memory access requests are input through the device manager 200. In the non-exclusive mode, software applications access the flash memory directly without going through the device manager 200. Alternate embodiments may use different modes including additional modes beyond the two modes described.

Using the exclusive mode, the device manager (200) is involved in the operation of the read while write/erase method of the present invention. Since software applications access the flash memory 203 and 205 through the device manager 200, the device manager 200 can track the state of all the managed flash memory devices 201 and 205. When the device manager 200 receives an interrupt from the processor 210 or other interrupting device, the device manager 200 is able to service the interrupt (e.g., issue a write operation to a memory device) and place the flash memory back into its read array mode after the interrupt has been serviced. As is well known in the art, the read array mode allows the memory to be treated as a normal memory by the processor.

If the device manager 200 is in the non-exclusive mode when it receives an interrupt, it does not know in what state the flash memories 203 and 205 have been placed. In this case, an application could be interrupting the device manager 200 to perform a read command to the flash device 203 or 205 while the flash device is executing an erase or write operation. However, the non-exclusive mode gives the system processor and operating system full control of when the next task is accomplished by a memory device 203 or 205.

Figure 3:
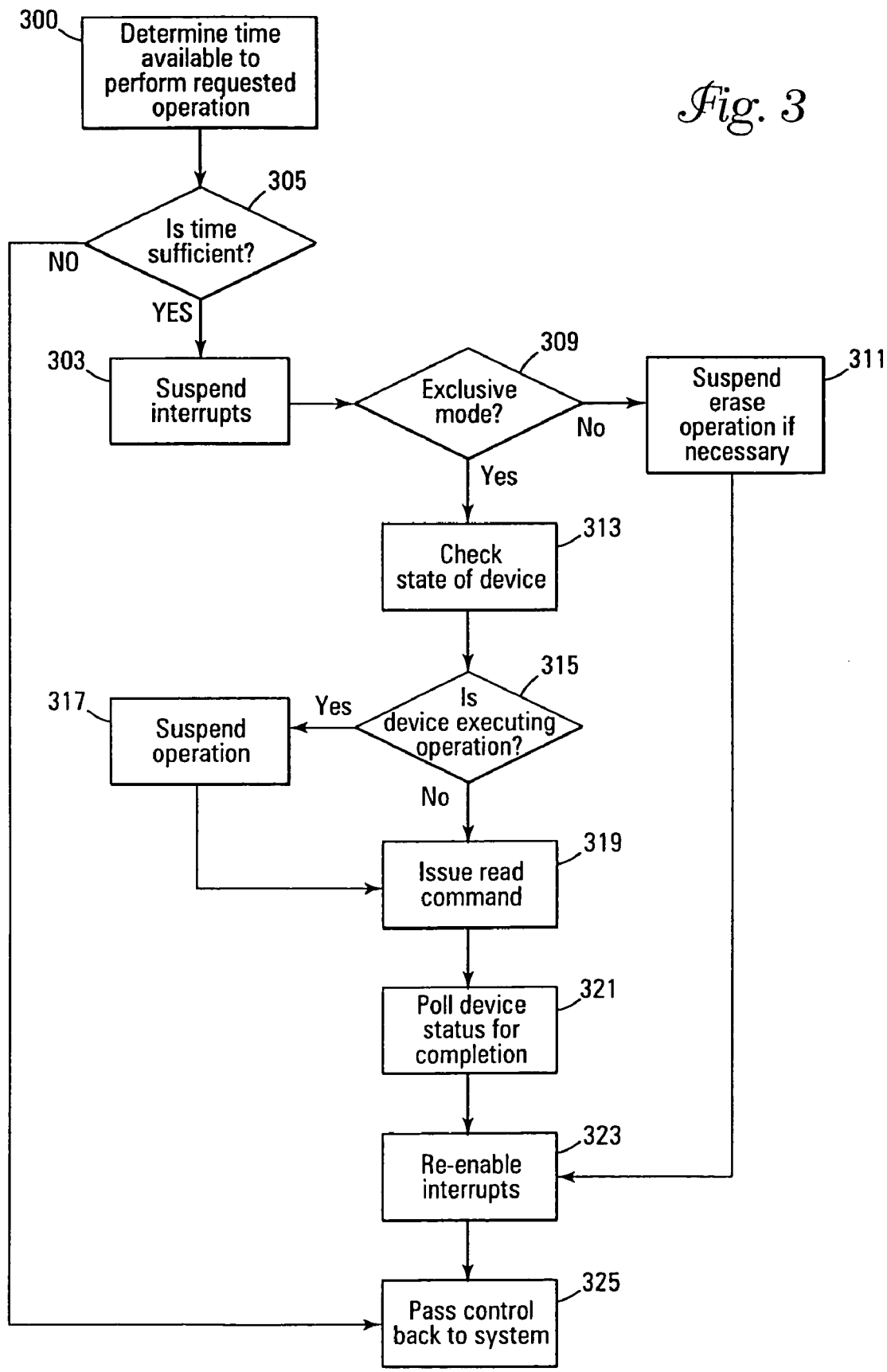
FIG. 3 shows a flowchart of one embodiment of a method for reading while writing to a single partition flash memory.

FIG. 3 illustrates a flowchart of one embodiment of a method for reading while writing/erasing to a single partition flash memory. The device manager, the system processor, and/or other system control circuitry may execute this method.

The time available to perform the requested instruction sequence (e.g., read, write, erase, or other task) is determined 300. This time does not have to include the time required to actually complete the requested operation. For example, the requested operation may be suspended due to external interrupts.

The time required for an instruction sequence may be determined by calculating the number of processor clock cycles required to accomplish the requested instruction sequence. Since the length of each clock cycle is known, the number of clock cycles required for the instruction sequence can be multiplied with the cycle time to determine the time required for a requested instruction sequence.

For example, if a read operation has been requested by an application, 8-12 microseconds may be required. If an erase operation has been requested, 0.5-1.0 second may be needed. These times are for purposes of illustration and the present invention is not limited to any one range of times for any operation.

In a multi-tasking environment, each task is allocated a fixed amount of processor time (i.e., time-slice) before it is pre-empted for the next scheduled task. Operating systems are able to report the amount of time a current task has before its time-slice is expired. This "time-available-left" is compared with the calculated "time required" for the requested instruction sequence. If there is sufficient time remaining 305 (i.e., time-available-left>time required), the operation continues. Otherwise, control returns to the system 325 until there is sufficient time to perform the requested instruction sequence.

If there is sufficient time to perform the instruction sequence, the interrupts to the device manager are suspended 303 while the method is executed. This prevents the methods of the present invention from being interrupted while executing.

It is determined if the device manager is operating in the exclusive or non-exclusive mode 309. This is determined by the receipt of the requested operation. If the requested operation is addressed to the device manager directly, the device manger is in the exclusive mode.

If the requested operation is addressed to one of the memory devices, the device manager is in the non-exclusive mode. In this case, an executing erase operation in the addressed memory device is suspended 311. The interrupts are then re-enabled 323 and control is passed back to the system 325.

If the device manager is operating in the exclusive mode 309, the device manager performs a status check of the memory device to which the requested operation is intended 313. This is accomplished, as is well known in the art, by reading the status register of the memory device.

If the memory device is busy, a busy status is returned to the device manager. If the memory device is idle, an idle status is returned. The form of these status indicators is different for various memory device manufacturers and the present invention is not limited to any one status indicator. For example, one busy status indicator might be a word of data wherein bit 7 is set to a logical 1. An idle status would then set that same bit to a logical 0.

If the memory device is busy executing an operation (e.g., write, erase) 315, that operation is suspended 317. The requested operation (e.g., read command) is then issued 319 to the memory device's control register. The memory device is then polled periodically to determine when the requested operation has been completed 321. In an alternate embodiment, the memory device is polled aperiodically. The device manager polled waiting for a response to the requested operation. For example, if the requested operation is a read command, the device manager is waiting for the return of data from the memory device.

When the polling returns an indication that the read command has been completed, the interrupts are re-enabled 323. Control of the memory devices is then passed back to the system 325.

In summary, the embodiments of the present invention assure the success of a read command by suspending any operation being executed by the memory devices. This prevents the application initiating the read command from obtaining a busy response from the flash device. The method determines if time is available to perform the requested operation. If the time available is sufficient to perform the requested operation and the memory device is executing an operation, the currently executing operation is suspended. The requested operation is then issued to the memory device. In one embodiment, the requested operation is a read command and the currently executing operation is a write operation (also referred to as a program operation) or an erase operation.

Numerous modifications and variations of the present invention are possible in light of the above teachings. It is therefore to be understood that within the scope of the appended claims, the invention may be practiced otherwise than as specifically described herein.

The invention claimed is:

1. A method of operation of a device manager coupled between a single partition non-volatile memory device and a controller circuit, the method comprising:
   determining if the memory device is executing one of a write or erase operation;
   determining a time available in the memory device to perform a read operation;
   determining if the time available is greater than a read time to perform the read operation;
   if the time available is greater than the read time, suspending the write or erase operation in the memory device; and
   issuing the read operation to the memory device.

2. The method of claim 1 and further including suspending interrupts to the device manager while the read operation is executed by the memory device.

3. The method of claim 2 and further including if the available time is less than the read time, re-enabling interrupts.

4. The method of claim 1 and further including polling the memory device to determine completion status of the read operation.

5. A method for device manager operation in a memory system having a plurality of single partition, non-volatile memory devices coupled to a controller circuit through a device manager, the method comprising:
   determining a time available to execute a read command from the controller circuit, the read command having a read execution time;
   suspending interrupts to the device manager if the time available is greater than the read execution time;
   determining whether the device manager is in an exclusive mode or non-exclusive mode;
   if the device manager is in the non-exclusive mode, suspending a currently executing operation in a first memory device;
   if the device manager is in the exclusive mode, determining whether an operation is currently executing in the first memory device;
   if the operation is currently executing in the first memory device when the device manager is in the exclusive mode, suspending the execution of the currently executing operation;
   issuing the read command to the first memory device;
   polling the memory device to determine completion status of the read command; and
   re-enabling interrupts to the device manager after completion of the requested operation.

6. The method of claim 5 and further including:
   if the time available is less than the read execution time, re-enabling the interrupts to the device manager; and
   returning control of the device manager and the memory device back to the memory system.

7. A non-volatile memory system comprising:
   a controller circuit for initiating a read operation;
   at least one single partition flash memory device coupled to the controller circuit; and
   a device manager coupled between the at least one flash memory device and the controller circuit, the device manager configured to determine a time available for the at least one memory device, to determine a read execution time by multiplying a quantity of clock cycles required for the read execution time with a cycle time, to determine if the time available is greater than the read execution time, to suspend a currently executing write operation in the at least one memory device if the time available is greater than the read execution time, and issuing the read operation to the at least one memory device.

8. The electronic system of claim 7 wherein the device manager further comprises means for suspending a currently executing erase operation.

9. The electronic system of claim 7 wherein the device manager further comprises means for suspending interrupt servicing.

10. A method for performing a read command while a write or erase operation is being executed by a single partition non-volatile memory device coupled to a device manager in a memory system having a controller circuit, the device manager having an exclusive mode and a non-exclusive mode, the method comprising:
    determining a time available for the memory device to execute the read command;
    determining a read command execution time for the memory device;
    suspending interrupt servicing by the device manager if the time available is greater than the read command execution time;
    if the time available is greater than the read command execution time and the device manger is in the exclusive mode, suspending any write operation being performed by the memory device;
    issuing the read command to the memory device;
    determining a completion status of the read command; and
    re-enabling interrupt servicing by the device manager.

11. The method of claim 10 and further including passing control of the memory device back to the controller circuit.

12. The method of claim 10 and further including:
    if the device manager is in the non-exclusive mode, suspending the currently executing write operation,
    re-enabling interrupt servicing by the device manager, and
    passing control of the memory device to the controller circuit.

* * * * *